United States Patent [19]

Nitschke et al.

[11] Patent Number: 4,658,202

[45] Date of Patent: Apr. 14, 1987

[54] CIRCUIT ARRANGEMENT FOR CONTROLLING THE CURRENT THROUGH AN ELECTRIC LOAD

[75] Inventors: Werner Nitschke, Ditzingen; Peter Taufer, Renningen, both of Fed. Rep. of Germany

[73] Assignee: Robert Bosch GmbH, Stuttgart, Fed. Rep. of Germany

[21] Appl. No.: 841,156

[22] Filed: Mar. 19, 1986

[30] Foreign Application Priority Data

Mar. 20, 1985 [DE] Fed. Rep. of Germany ....... 3509961

[51] Int. Cl.[4] .............................................. G05F 1/565
[52] U.S. Cl. ..................................... 323/275; 323/303
[58] Field of Search ............... 323/274, 275, 276, 277, 323/278, 299, 303; 123/472, 478, 479, 357; 361/152, 170

[56] References Cited

U.S. PATENT DOCUMENTS 4,499,412  2/1985  Locher et al. ...................... 361/152

FOREIGN PATENT DOCUMENTS 43176  3/1983  Japan .................................. 363/50

Primary Examiner—Peter S. Wong
Assistant Examiner—Judson H. Jones
Attorney, Agent, or Firm—Walter Ottesen

[57] ABSTRACT

The invention is directed to a circuit arrangement for controlling the current through an electric load such as an electromagnetic load. A current-controlling element controls the current through the load in response to a control unit. The voltage at the load is compared with a voltage which depends on the control unit which drives the current-controlling element. The current through the electric load is then controlled in dependence upon the result of this comparison. An embodiment is described by means of which the entire circuit arrangement is protected against function failures or even destruction.

9 Claims, 1 Drawing Figure

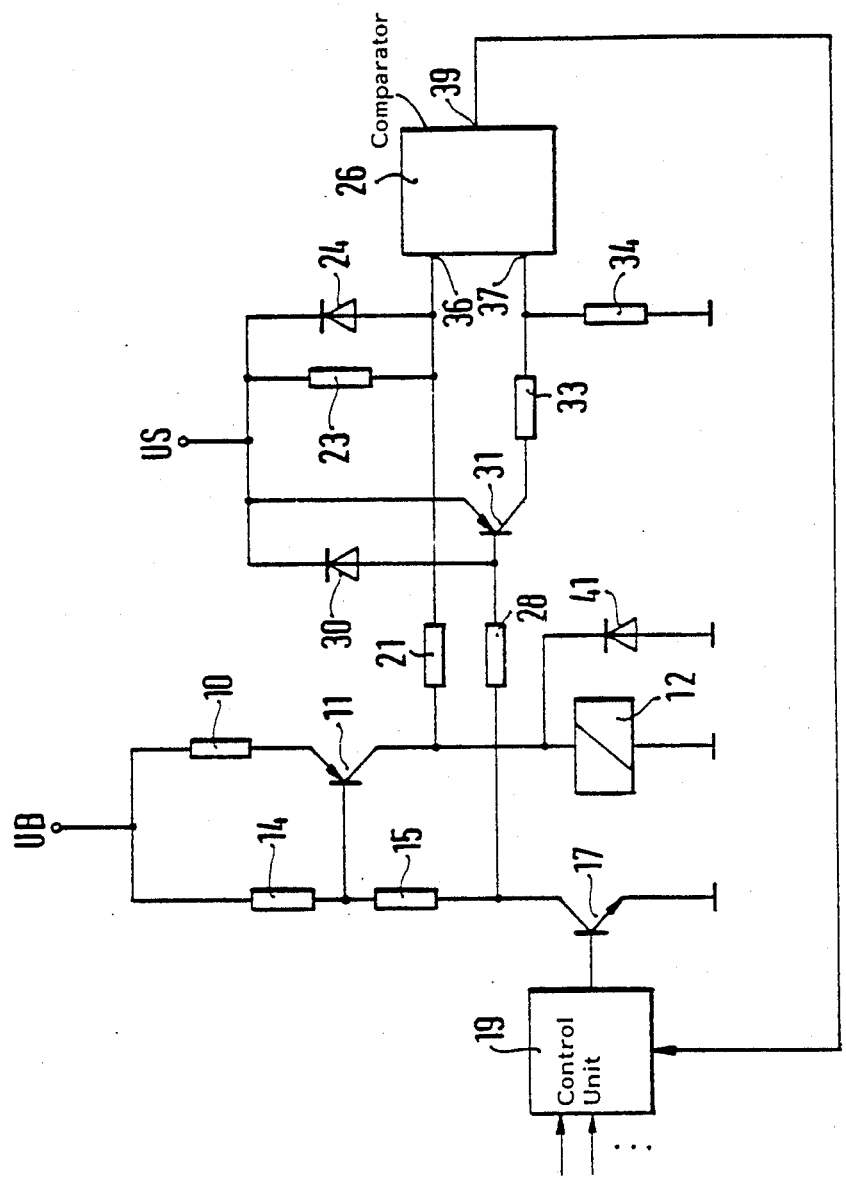

CIRCUIT ARRANGEMENT FOR CONTROLLING THE CURRENT THROUGH AN ELECTRIC LOAD

FIELD OF THE INVENTION

The invention relates to a circuit arrangement for controlling the current through an electric load and especially an electromagnetic load.

BACKGROUND OF THE INVENTION

It is known to protect an electric circuit arrangement against faults or even destruction by providing for the detection of a short circuit and disabling the entire circuit promptly in the event of a short circuit of the electric load. One possibility of such a protection provides that the enabled state of the circuit is only an unstable operating condition. This unstable condition returns, in the event of a short circuit or some other fault of the circuit, immediately to its stable condition, which is the disabled state of the entire circuit. In such a circuit configuration, the electric load is applied to the supply voltage and switched on and off with respect to ground. Particularly in the development and test phase of such a circuit, this has the substantial disadvantage that unwanted short circuits of the load with respect to ground may cause faults or even destruction. Also, the known circuit arrangements are very complex and therefore costly.

SUMMARY OF THE INVENTION

In contrast to the state-of-the-art described, the circuit arrangement for controlling the current through an electric load such as an electromagnetic load as disclosed in the invention, affords the advantage of providing a simple and low-cost circuit by means of which short circuits of the load connected to ground are reliably detected. This is accomplished in that the voltage across the load connected to ground is compared with a voltage which depends on a device acting upon the control element for the load, with the current through the load being controlled in dependence on the comparison result.

Further advantages and improvements of the circuit arrangement of the invention will become apparent from the subsequent description, the drawing and the claims.

BRIEF DESCRIPTION OF THE DRAWING

The sole FIGURE of the drawing is a circuit diagram showing an embodiment of the circuit arrangement of the invention.

DESCRIPTION OF THE PREFERRED EMBODIMENTS OF THE INVENTION

The invention relates to a circuit arrangement for controlling the current through an electric load and especially an electromagnetic load. The load, for example, may be a solenoid valve, a servomotor, or the like. Of particular advantage is the use of the circuit arrangement in connection with internal combustion engines, especially when fuel is injected into the combustion chambers of the engine and/or when the idle speed of the internal combustion engine is influenced. It is the object of the circuit arrangement of the invention to detect short circuits of the electric load fast and reliably in order to thereby protect the entire circuit arrangement against faults or even destruction.

The drawing shows an embodiment of the circuit arrangement of the invention. Referring to the drawing, a measuring resistor 10, a current-controlling element 11 which may be a power transistor, for example, and the load 12 are connected in series from a battery voltage UB to ground, in the order just mentioned. The two resistors 14 and 15 and the transistor 17 are also series-connected from the battery voltage UB to ground. The circuit node between the two resistors 14 and 15 is connected to the base of transistor 11. By contrast, the base of transistor 17 is acted upon by a control unit 19 which in turn depends on at least one input quantity.

For example, if the electromagnetic load is an injection valve feeding fuel into the combustion chambers of an internal combustion engine, the input quantities for the control unit 19 may be signals relating to the temperature of the internal combustion engine, the load condition of the internal combustion engine, or the like. However, it is also possible for the load 12 to be used somewhere else in the internal combustion engine in which case other input quantities would apply for control unit 19.

From the circuit node of transistor 11 and load 12, a resistor 21 leads to an input 36 of a comparator 26. Input 36 is further connected to a stabilized voltage US via a resistor 23 and a diode 24 connected in parallel. Further, the circuit node of resistor 15 and transistor 17 is connected to a resistor 28. The other terminal of resistor 28 is connected to the stabilized voltage US via a diode 30 and also to the base of a transistor 31. The collector-emitter path of transistor 31 leads from the stabilized voltage US to a resistor 33 having its second terminal applied to an input 37 of comparator 26. Input 37 is further connected to ground via a resistor 34. The output of comparator 26, which is assigned reference numeral 39, forms an input signal for control unit 19. Diode 41 serves for free-wheeling the load 12.

In the circuit arrangement of the invention, it is important for the battery voltage UB to be greater than the stabilized voltage US, for example, UB=12 V, US=5 V. Further, it is important for the resistance of measuring resistor 10 to be low compared to the resistance of the load 12 and, at the same time, for the resistance of the load 12 to be low compared to the resistance of the two resistors 21 and 23.

Overall, the circuit arrangement shown in the drawing has four operating conditions; namely, the switched-on and the switched-off state of the current-controlling element 11 with the load 12 intact and the switched-on and switched-off state with the load defective (short-circuited). If current-controlling element 11 is switched on, that is, current flows therethrough, the two transistors 17 and 31 are also switched on, regardless of the load 12. If, however, current-controlling element 11 is blocked, in which case no current flows, the two transistors 17 and 31 are also blocked, that is, nonconducting.

It is now assumed that transistor 17 is switched into its conducting state by control unit 19 and that the load is intact. As a result, the input 36 of comparator 26 lies at a potential which is greater than the value of the stabilized voltage US since, with the load 12 not defective and resistors 10 and 21 chosen correspondingly, the circuit node of current-controlling element 11 and load 12 lies at a potential, the value of which is likewise greater than the value of the stabilized voltage US. By contrast, input 37 of comparator 26 lies at a potential which is smaller than the value of the stabilized voltage US. This is due to the voltage divider formed by resistors 33 and 34 which are connected to the stabilized voltage US via conducting transistor 31. Overall, therefore, input 36 of comparator 26 has a higher potential than input 37, as a result of which output 39 of comparator 26 delivers a signal indicating the correct functioning of the entire circuit arrangement.

It is now assumed further that control unit 19 has switched off transistor 17 and that the load 12 is intact in the first case and defective in the second case. Nonconducting transistor 17 causes transistor 31 to be switched off, too, as a result of which input 37 of comparator 26 is applied to ground via resistor 34. With transistor 17 cut off, input 36 of comparator 26 lies in any case at a potential greater than 0 volts, because resistors 23 and 21 operate as a voltage divider also in the event of the load 12 being short-circuited. Accordingly, with the current-controlling element 11 switched off, input 36 of comparator 26 has in any case a potential greater than that of input 37, so that output 39 of comparator 26 signals again the correct functioning of the entire circuit arrangement.

Since it is the object of the entire circuit arrangement to detect short circuits of the load 12 to thereby avoid faults or even destruction of the circuit arrangement, the operating condition in which the current-controlling element 11 is switched off while at the same time the load 12 is defective, that is, shorted, is also considered a correct operating condition because the entire circuit arrangement is disabled which prevents it from being destroyed. The same applies for the operating condition when the load 12 is open-circuited while the entire circuit arrangement is disabled. In this event, the output 39 of comparator 26 will also signal the correct functioning of the circuit arrangement since the circuit arrangement cannot be destroyed under these conditions. It is important that the instant the circuit arrangement is enabled with the load defective or that the instant the load becomes defective with the circuit arrangement enabled, this faulty operating condition is immediately detected and the entire circuit arrangement is disabled.

As the last operating condition, it is now assumed that control unit 19 has switched transistor 17 into its conducting state and that the load 12 is defective, that is, shorted. As already stated, if current-controlling element 11 is switched on, input 37 of comparator 26 has a potential which is less than the stabilized voltage US, yet greater than 0 volts. In view of load 12 being shorted, the circuit node of resistor 21 and current-controlling element 11 is applied to ground, as a result of which the input 36 of comparator 26 is also less than the stabilized voltage US, yet greater than 0 volts.

By suitably dimensioning resistors 21 and 23 or 33 and 34, it is possible that in this particular operating condition the potential of input 36 is less than the potential of input 37. Thus, this operating condition differs from the operating conditions so far discussed, so that output 39 of comparator 26 now delivers a signal indicating the faulty function of the entire circuit arrangement. By means of this error signal, the control unit 19 immediately switches off transistor 17. As a result, any flow of current via measuring resistor 10 and current-controlling element 11 likewise ends immediately. It is thus possible to protect the entire circuit arrangement and in particular measuring resistor 10 and the current-controlling element 11 against being destroyed by excessive currents.

The above-described circuit arrangement functions in the same manner when the load 12 passes from its intact condition to its defective condition while the current-controlling element 11 is switched on. With this transition from intact to defective condition the error signal will also be promptly released at output 39 of comparator 26, causing the entire circuit arrangement to be disabled. If, however, the load 12 does not become shorted but open-circuited, the circuit arrangement described will interpret this as a correct function as already explained, because in this operating condition, even with current-controlling element 11 conducting, the current flowing through measuring resistor 10 and current-controlling element 11 is sufficiently low not to be dangerous for these elements or the remaining circuit arrangement.

In summary, it thus results that the circuit arrangement described only switches off the current via current-controlling element 11 if a short circuit of the load 12 makes it necessary to protect the entire circuit arrangement against destruction. In all other operating conditions, including a defective load 12, the circuit arrangement is not disabled because these conditions do not constitute a danger for the circuit arrangement.

The circuit arrangement described and shown is an example of a possible embodiment of the invention. For a person skilled in the art it is possible to modify, expand or simplify the circuit arrangement described.

In this connection, it is possible, for example, to omit the diode 30 altogether under specific circumstances or to configure the comparator 26 as a simple comparator. The control unit 19 can also be configured in various ways which, however, are known and not the subject of this invention.

It is understood that the foregoing description is that of the preferred embodiments of the invention and that various changes and modifications may be made thereto without departing from the spirit and scope of the invention as defined in the appended claims.

What is claimed is:

1. A circuit arrangement for controlling the current through an electric load such as an electromagnetic load connected to ground, the circuit arrangement comprising:
   current control means connected to the load for controlling the current therethrough;
   drive means for generating a drive signal for driving said current control means;
   first comparator input circuit means for providing a first voltage signal corresponding to the voltage across said load;
   second comparator input circuit means for providing a second voltage signal dependent upon said drive means;
   comparator means for comparing said first voltage signal with said second voltage signal and for generating an output signal indicative of the comparison; and,
   said drive means being adapted for driving said current control means in dependence upon said output signal thereby controlling the current through said load.

2. A circuit arrangement for controlling the current through an electric load such as an electromagnetic load connected to ground, the circuit arrangement comprising:
   current control means connected to the load for controlling the current therethrough;

drive means for generating a drive signal for driving said current control means;

first comparator input circuit means for providing a first voltage signal corresponding to the voltage across said load;

second comparator input circuit means for providing a second voltage signal dependent upon said drive means;

comparator means for comparing said first voltage signal with said second voltage signal and for generating an output signal indicative of the comparison;

said drive means being adapted for driving said current control means in dependence upon said output signal thereby controlling the current through said load; and, said first comparator input circuit means including: a parallel circuit including a resistor and a diode mutually connected in parallel; and, a further resistor; said parallel circuit, said further resistor and said load conjointly defining a first series circuit.

3. The circuit arrangement of claim 2, said current control means and said load conjointly defining a second series circuit, said circuit arrangement comprising: first voltage supply means connected to said first series circuit; and, second voltage supply means connected to said second series circuit.

4. The circuit arrangement of claim 3, the voltage supplied by said second voltage supply means being greater than the voltage supplied by said first voltage supply means.

5. The circuit arrangement of claim 4, said second comparator input circuit means comprising: a voltage divider and a transistor for conjointly forming said second voltage signal, said voltage divider being connected to said first voltage supply means through said transistor.

6. The circuit arrangement of claim 5, said transistor being connected to said drive means so as to be switchable by said drive signal.

7. A circuit arrangement for controlling the current through an electromagnetic apparatus of an internal combustion engine, the electromagnetic load being connected to ground and the circuit arrangement comprising:

current control means connected to the load for controlling the current therethrough;

drive means for generating a drive signal for driving said current control means;

first comparator input circuit means for providing a first voltage signal corresponding to the voltage across said load;

second comparator input circuit means for providing a second voltage signal dependent upon said drive means;

comparator means for comparing said first voltage signal with said second voltage signal and for generating an output signal indicative of the comparison; and, said drive means being adapted for driving said current control means in dependence upon said output signal thereby controlling the current through said load.

8. The circuit arrangement of claim 7, said electromagnetic apparatus being an injection valve for metering fuel to a combustion chamber of the engine.

9. The circuit arrangement of claim 7, said load being a valve for influencing the no-load rotational speed of the engine.

* * * * *